(12) United States Patent
Walker et al.

(10) Patent No.: US 7,564,263 B2
(45) Date of Patent: Jul. 21, 2009

(54) HIGH-SPEED LOGIC SIGNAL LEVEL SHIFTER

(75) Inventors: James T. Walker, Palo Alto, CA (US); Jimes Lei, Milpitas, CA (US)

(73) Assignee: Supertex, Inc., Sunnyvale, CA (US)

( * ) Notice: Subject to any disclaimer, the term of this patent is extended or adjusted under 35 U.S.C. 154(b) by 0 days.

(21) Appl. No.: 11/379,509

(22) Filed: Apr. 20, 2006

(65) Prior Publication Data
US 2006/0238527 A1    Oct. 26, 2006

Related U.S. Application Data

(60) Provisional application No. 60/673,568, filed on Apr. 21, 2005.

(51) Int. Cl.
*H03K 19/0175* (2006.01)

(52) U.S. Cl. .................. 326/63; 326/81; 365/189.11

(58) Field of Classification Search ............ 326/80–83, 326/62–63, 68; 327/201–203, 208–218
See application file for complete search history.

(56) References Cited

U.S. PATENT DOCUMENTS

| | | | | |
|---|---|---|---|---|
| 4,504,747 A | * | 3/1985 | Smith et al. .................. 326/70 |
| 6,600,679 B2 | * | 7/2003 | Tanzawa et al. .......... 365/189.11 |
| 6,714,060 B2 | * | 3/2004 | Araki .......................... 327/202 |
| 7,176,720 B1 | * | 2/2007 | Prather et al. ................. 326/80 |
| 2003/0107422 A1 | * | 6/2003 | Miyagi ....................... 327/215 |
| 2004/0036517 A1 | * | 2/2004 | Ahn ........................... 327/202 |

* cited by examiner

*Primary Examiner*—Rexford N Barnie
*Assistant Examiner*—Christopher Lo
(74) *Attorney, Agent, or Firm*—Jeffrey D. Moy; Weiss & Moy, P.C.

(57) ABSTRACT

A high speed logic signal level shifter is comprised of: a logic signal buffer for receiving logic signal information and having true and complement state differential outputs; a binary flip-flop circuit with set and reset inputs; a first coupling capacitor connected from the true buffer output to the set input of the binary flip-flop circuit; and a second coupling capacitor connected from the complement buffer output to the reset input of the binary flip-flop circuit. The high speed logic signal level shifter transfers a fast logic signal across a high voltage difference by making use of rapid voltage changes transmitted through small capacitors. The signal changes carried by the capacitors are about 10 times faster than any expected voltage transient on VPP or VNN. Furthermore, the differential coupling circuit is used to provide enhanced protection against undesired circuit switching during supply voltage changes.

10 Claims, 5 Drawing Sheets

HIGH-SPEED LOGIC SIGNAL LEVEL SHIFTER

RELATED APPLICATIONS

The present patent application is related to a Provisional Application having a Ser. No. 60/673,568, filed Apr. 21, 2006, entitled "A HIGH SPEED LOGIC SIGNAL LEVEL SHIFTER", in the name of the same inventors. The present patent application claims the benefits of the Provisional Application under 35 U.S.C. §119(e)

BACKGROUND OF THE INVENTION

1. Field of the Invention

The invention relates to a high speed logic signal level shifter, and specifically to a circuit for transferring a fast logic signal across a high voltage difference between two circuit sections in an integrated circuit.

2. Background Information

A high speed DC coupled logic level translator is particularly useful for high speed, high current CMOS drivers. High speed, high current drivers are used in applications such as medical ultrasound and non-destructive testing, where MOSFET power transistors must be driven quickly with signals originating in low voltage logic circuits. Additional applications in switch mode power supplies and other circuits requiring the fast switching of MOSFET power transistors are possible.

A critical aspect of a high speed DC coupled logic level translator circuit is that circuit must transfer the signal changes with minimum propagation delay time, and have minimal sensitivity to changes in the voltage supply voltage VPP and VNN. Problems with the logic signal transfer can be caused by transient or fast changes in the voltage VPP and VNN interfering with the coupling of the logic signals across the voltage barrier. One means which has been successfully used to overcome this problem is to use large pulsed currents in the transfer circuitry. The current pulses are larger than any capacitive displacement currents caused by expected voltage transients, so the circuit operates without error. Power is minimized by use of very short current pulses to transfer information about logic state changes. However, a simpler solution not requiring large pulsed currents in the transfer circuitry would be desirable.

Therefore, a need exists to provide a device and method to overcome the above problem. The device and method will provide a high speed logic signal level shifter. The high speed logic level shifter must be able to transfer a fast logic signal across a high voltage difference between two circuit sections in an integrated circuit. The high speed logic level shifter must be able to transfer a fast logic signal across a high voltage difference between two circuit sections in an integrated circuit without using large pulsed currents in the transfer circuitry.

SUMMARY OF THE INVENTION

A high speed logic signal level shifter is comprised of: a logic signal buffer for receiving logic signal information and having true and complement state differential outputs; a binary flip-flop circuit with set and reset inputs; a first coupling capacitor connected from the true buffer output to the set input of the binary flip-flop circuit; and a second coupling capacitor connected from the complement buffer output to the reset input of the binary flip-flop circuit. The high speed logic signal level shifter transfers a fast logic signal across a high voltage difference by making use of rapid voltage changes transmitted through small capacitors. The signal changes carried by the capacitors are about 10 times faster than any expected voltage transient on VPP or VNN. Furthermore, the differential coupling circuit is used to provide enhanced protection against undesired circuit switching during supply voltage changes.

The present invention is best understood by reference to the following detailed description when read in conjunction with the accompanying drawings.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper," "lower," "front," "back," "over," "under," and similar such terms are not to be construed as limiting the invention to a particular orientation. Instead, these terms are used only on a relative basis.

Figure 1:
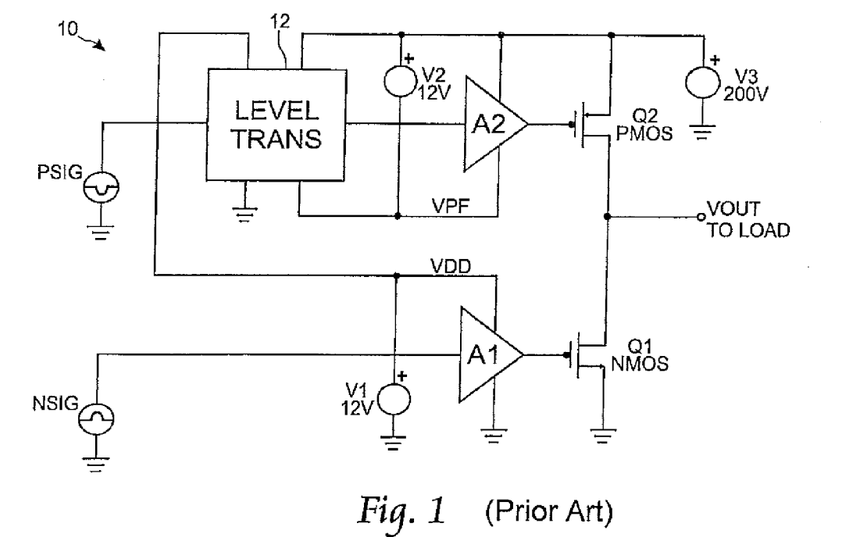
FIG. 1 is a simplified schematic diagram of a prior art unipolar ultrasonic transducer driver.

Referring to FIG. 1, a unipolar output stage 10 is shown. In this case, an NMOS high voltage transistor Q1 (hereinafter NMOS transistor Q1) with its source grounded is arranged with its drain connected to the drain of a PMOS high voltage transistor Q2 (hereinafter PMOS transistor Q2) with its source connected to a supply of high voltage V3. The unipolar output stage 10 is intended to provide a unipolar output signal to drive the transducer load.

An input signal NSIG is intended to turn on the NMOS transistor Q1 when it is at a higher logic level, and off when it is at a lower logic level, such as ground. In order to obtain sufficiently fast drive for the control gate of the NMOS transistor Q1, an amplifier A1 is used to amplify the input signal NSIG and provide additional current. This current rapidly charges the input capacitance of the NMOS transistor Q1 to give fast control of the output signal VOUT.

In a similar manner, an input signal PSIG is intended to turn on the PMOS transistor Q2 when it is at a lower logic level, such as ground, and off when it is at a higher logic level. This signal is inverted compared to the signal NSIG because PMOS transistor Q2 requires a control input that is negative relative to its source voltage to turn it on. All circuitry shown in the FIG. 1 is non-inverting. Logic signal polarity inverters may be inserted in either path to reverse the input signal polarity required to turn on the associated output transistor without altering the basic function of this design.

Obtaining the drive signal for PMOS transistor Q2 is more complicated because the input signal is a logic swing relative to ground, whereas the drive required for the PMOS transistor Q2 needs to be relative to the source terminal of the PMOS transistor Q2. The high voltage could for example be 200 volts DC from the source V3, whereas the transistors Q1 and Q2 require only 5 to 12 volts of signal between their gate and source terminals for operation. Designate the high voltage supply voltage as VPP provided by source V3, the grounded low voltage supply as VDD provided by the source V1, and a floating low voltage supply as VPF provided by the source V2. The floating low voltage supply VPF is typically negative relative to VPP, giving a voltage level below VPP for driving the PMOS transistor Q2, and the other voltage supplies are positive. Low voltage logic circuits could easily provide the gate drive signal for the NMOS transistor Q1, but the PMOS transistor Q2 is more difficult to drive since its source is connected to VPP. An auxiliary floating power supply VPF referenced to the high voltage supply VPP can provide power for floating logic circuitry attached to it, but a means must be provided for transmission of the fast logic signals from near ground level to near VPP. The logic swings in both the grounded logic circuitry and the floating logic circuitry would typically be the same, approximately 12 volts in the present example, but this is not a requirement. Therefore both VDD and (VPP-VPF) would be 12 volts for this example.

The translation of the logic input signal from the ground reference to the VPP reference is done by the high voltage level translator 12 in FIG. 1. The level translator 12 accepts a low voltage logic swing input relative to ground, and translates it to a low voltage logic swing relative to the high voltage VPP. A critical aspect of the level translator 12 is that it must transfer the signal changes with minimum propagation delay time, and have minimal sensitivity to changes in the high voltage VPP. The input part of the level translator 12 is powered by the ground referenced voltage supply VDD, and the output part of the level translator 12 is powered by the floating VPP referenced voltage supply VPF.

The output of the high voltage level translator 12 is amplified by the amplifier A2 before being used as the gate drive for the PMOS transistor Q2. This is done similarly to the signal path for NMOS transistor Q1 so that sufficiently fast signal transitions may be produced at the gate of the PMOS transistor Q2. The amplifier A2 puts out a large amount of current drive to quickly change the voltage on the input gate-source capacitance of the PMOS transistor Q2.

Figure 2:
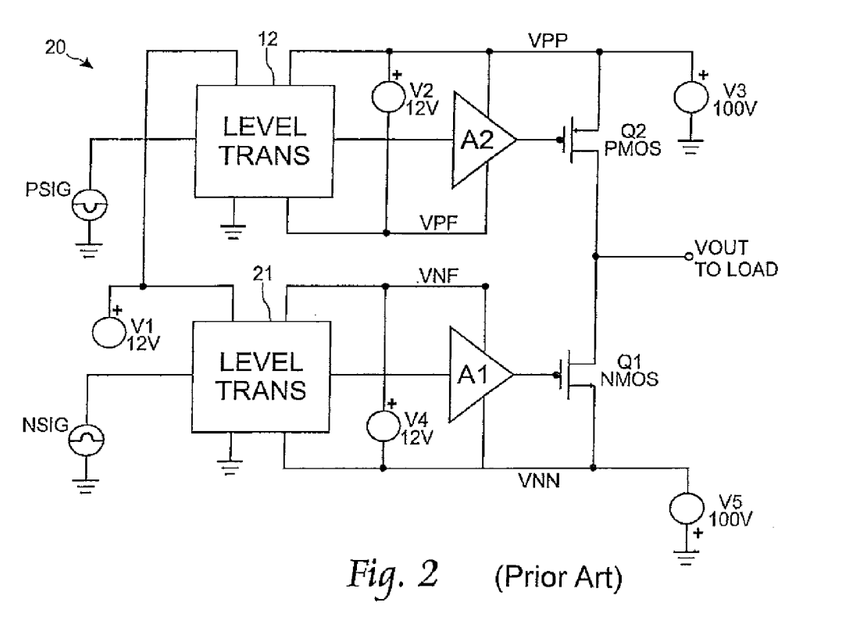
FIG. 2 is a simplified schematic diagram of a prior art bipolar ultrasonic transducer driver.

Referring now to FIG. 2, wherein like numerals and symbols represent like elements, a high voltage output stage with bipolar output polarity capability 20 (hereinafter bipolar output stage 20) is shown. In this design, the NMOS transistor Q1 is connected to a negative power supply VNN instead of ground. When NMOS transistor Q1 is on, the output signal VOUT is VNN, and when PMOS transistor Q2 is on, the output signal VOUT is VPP. VNN and VPP are usually of equal magnitude, but that is not a fundamental requirement. In order to construct the bipolar output stage 20, it is necessary to add the additional level translator 21 in the signal path to NMOS transistor Q1. The level translator 21 acts in a manner similar to that described for the level translator 12 in FIG. 1. The level translator 21 transfers the input signal NSIG from its ground reference to a signal referenced to the negative high voltage VNN. The circuit arrangement and performance may be similar to that used in the level translator 12, with complementary changes made in some circuitry to accommodate the negative high voltage polarity. An additional floating power supply V4 is required to generate the supply voltage VNF relative to the negative power level VNN. The buffer amplifier A1 is powered by the floating power supply in this case since the gate driver required by the NMOS transistor Q1 is relative to VNN. In a typical application, the VPP value may be +100 volts and the VNN value may be −100 volts, giving a total output swing of 200 volts as in the unipolar output stage 10 presented in FIG. 1. The main advantage of the bipolar output stage 20 is that it may generate a waveform which starts and ends at zero volts, regardless of the polarity of the first pulse in an output wave train. Therefore completely complementary wave shapes may be generated, depending on the drive signals used at PSIG and NSIG.

Problems with the logic signal transfer can be caused by transient or fast changes in the high voltage VPP and VNN interfering with the coupling of the logic signals across the voltage barrier. One means which has been successfully used to overcome this problem is to use large pulsed currents in the transfer circuitry. The current pulses are larger than any capacitive displacement currents caused by expected voltage transients, so the circuit operates without error. Power is minimized by use of very short current pulses to transfer information about logic state changes. However, a simpler solution not requiring large pulsed currents is desirable.

Figure 3:
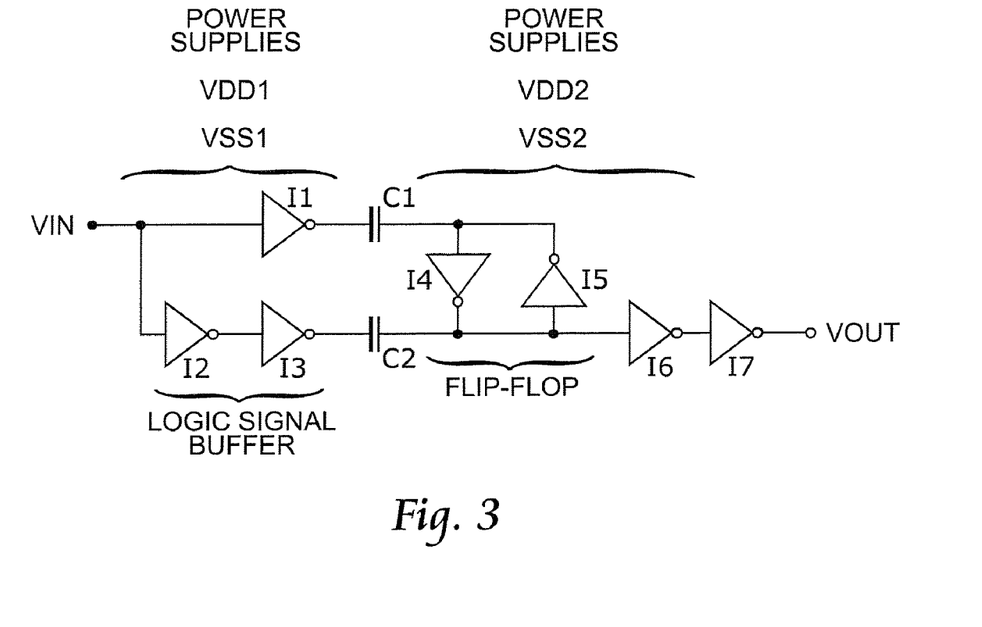
FIG. 3 is a logic diagram of a high speed logic level shifter according to the present invention.

Referring now to FIG. 3, a simple logic diagram of the inventive level translator is shown. Six logic inverter stages are used together with two capacitors. A logic inverter has the property that if its input is a logic low level, its output will be at a logic high level; if its input is at a logic high level, then its output is at a logic low level. For the purposes of this discussion, the logic inverters are CMOS devices, each containing au NMOS and a PMOS transistor as detailed in FIG. 4.

Figure 4:
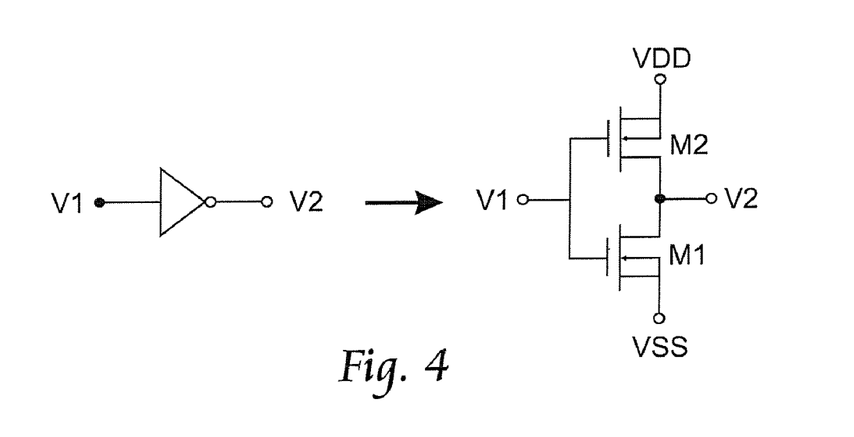
FIG. 4 show the construction of the inverters used in the high speed logic level shifter of the present invention.

In FIG. 4, the NMOS transistor M1 turns on if the input voltage V1 is a logic high level at approximately VDD, and the PMOS transistor M2 turns on if the input voltage is a logic low level at approximately VSS. For input voltages between these two values, the output voltage will be somewhere between VSS and VDD.

Figure 5:
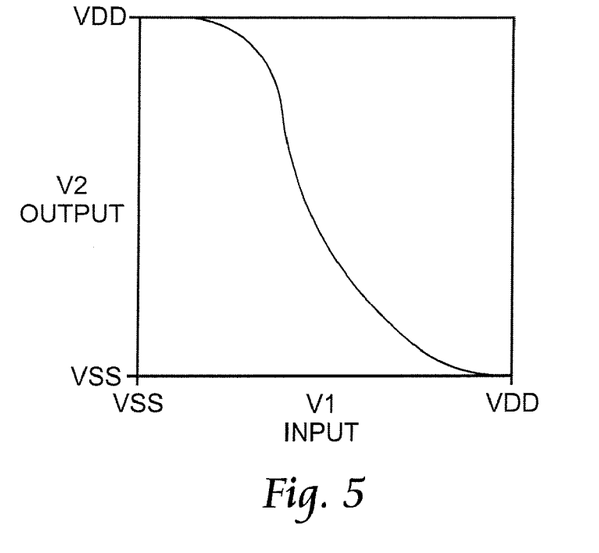
FIG. 5 shows the transfer curve of the inverters used in the high speed logic level shifter of the present invention.

FIG. 5 shows a typical DC transfer curve between the inverter input voltage V1 and its output voltage V2. In the middle of the range, the inverter exhibits a large incremental voltage gain. Because of the voltage gain in the inverter stage, a logic signal sent through a series of inverters or logic gates will produce outputs more closely approaching VSS and VDD. It is important to note that at each end of the transfer curve, one of the MOS transistors is highly conducting and the other is off. The conducting MOS transistor has a non-zero resistance between its source and drain, so that voltages may he impressed on the inverter output if enough current is available.

Referring back to FIG. 3, the inverters I4 and I5 are connected in a loop so that positive feedback will occur. This causes their outputs to assume one of the two binary logic states, at either VSS2 or VDD2. A connection of this type creates a flip-flop, which is able to remember indefinitely one of two logic states. As noted above, the inverter outputs will provide a finite resistance connected to the supply voltages and are not firmly fixed in voltage level. Coupling capacitors C1 and C2 are connected to the two inverter outputs I5 and I4 respectively, so that fast current pulses coupled to the inverter outputs may be used to force a change in the state of the inherent flip-flop. Fast current pulses are generated by the inverter pair I1 and I3, with inverter I2 serving to reverse the logic state of one of the two outputs. The inverter group I1, I2, and I3 constitutes a logic signal buffer with a single input and a differential output providing both true and complementary outputs. In order for the signals to be transmitted to the receiving inverter pair I4 and I5 with maximum amplitude to give best performance, the inverters I4 and I5 are made using MOS transistors of minimum size. The capacitors C1 and C2 are chosen to have a value approximately 10 times the nodal capacitance of the cross coupled inverter pair I4 and I5. Capacitors fabricated in an integrated circuit typically have one side which has a parasitic capacitance to the circuit substrate. To minimize the undesired parasitic capacitance in the flip-flop, the coupling capacitors C1 and C2 are fabricated with their lower plates which have the excess substrate capacitance connected to the driving inverters I1 and I3. These capacitor plates are marked in FIG. 3 by a heavy marking. Note that it is possible to construct the flip-flop made with I4 and I5 using more complicated logic gates with additional inputs for auxiliary purposes. The only requirement is that I4 and I5 when connected together create a circuit with two or more stable states of operation.

When input signal transitions occur at VIN of FIG. 3, the inverters I1 and I3 change output state. Since these inverters are made to be substantially larger than the cross-coupled pair I4 and I5, their output current is able to overdrive the voltage present at the outputs of inverters I4 and I5. This transient current is coupled through the two capacitors C1 and C2 to control the logic state of I4 and I5. If the logic state is already in the condition which corresponds to the new input VIN, then the outputs of I4 and I5 will exhibit transient voltage spikes which cause their MOS transistor drains to conduct current to their body terminals, and therefore to the supplies VSS2 or VDD2. A change of state therefore does not occur. If the logic state is different and does not correspond to the new input VIN, then the MOS transistor drains are forced toward the opposite supply voltage as compared to their present state, and a change of state will occur. Positive feedback caused by the loop connection of the two inverters I4 and I5 acts to restore the inverter outputs to new logic values which are either VSS2 or VDD2. Therefore, it is only necessary to couple enough current through the capacitors C1 and C2 to cause the inverter outputs to move slightly more than halfway between the supplies VSS2 and VDD2. The positive regeneration will supply the impetus for a full logic swing output. In the course of the regeneration, the voltage and charge on the coupling capacitors C1 and C2 are restored to their initial values. An assumption is made here that the input logic transitions are sufficiently spaced to allow the circuit to attain a final value state with unchanging voltages between transitions. If the input signals are too fast, partial switching will occur in the circuit, and the logic output will ultimately fail to follow the input signals.

It should be note that the inverters I1, I2, and I3 are operated by one set of power supplies VDD1 and VSS1, and the inverters I4, I5, I6, and I7 are operated by another set of power supplies VDD2 and VSS2. A common mode voltage difference between these two groups of power supplies may be applied as the high voltage VPP or VNN. The capacitors C1 and C2 serve to block this high voltage while transmitting fast signal transitions to the inverters I4 and I5.

Since the nodal capacitance in the flip-flop formed by I4 and I5 is critical to proper operation of the circuit, an additional buffer formed by inverters I6 and I7 is typically used as a signal buffer. The output of the buffer is a replica of the logic states at the input VIN. One inverter could be omitted to obtain an inverted output signal VOUT if desired. This buffer could of course be part of a more complex logic circuit such as a NAND gate, NOR gate, or other CMOS logic structure.

Although the circuits detailed here make use of CMOS construction, they may be easily translated to other logic families by one familiar with the state of the art. Use of CMOS circuitry is not required to obtain similar functionality.

Figure 6:
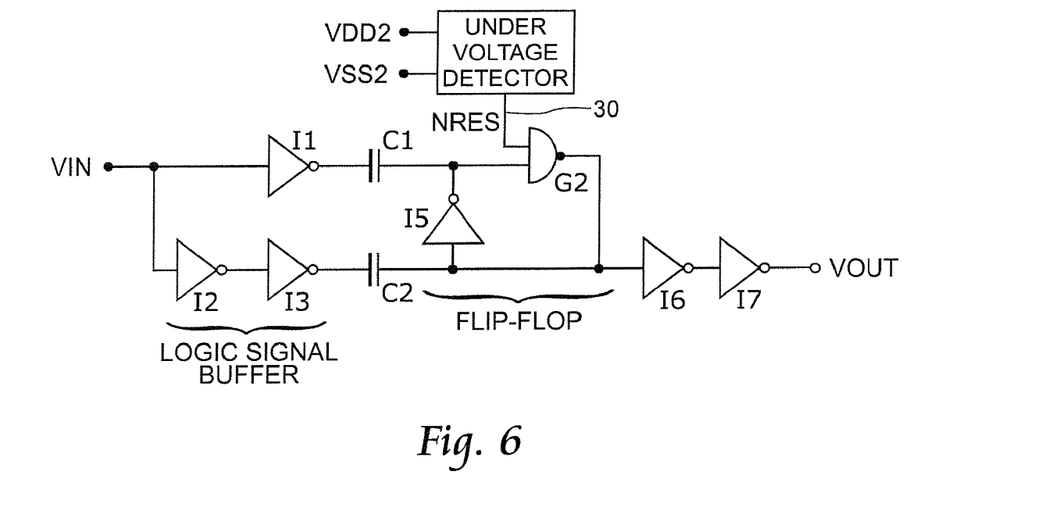
FIG. 6 is a logic diagram of a high speed logic level shifter with under voltage reset according to the present invention.

In a practical application, when power is first applied, the state of VOUT may not correspond to the state of VIN. This random startup state will depend on small asymmetries in the construction of the transistors, wiring, and components in the inverter circuit I4 and I5, together with noise influences. Therefore it is desirable to modify the circuit to permit startup in a known state. One method of doing this is shown in FIG. 6. In this circuit an additional means has been provided to permit resetting the state of the logic level translator to a known value. The inverter I4 of FIG. 1 has been replaced with a NAND logic gate G2. Logic gate G2 is made with CMOS logic as is known in the state of the art. The NAND gate G2 has the property that if any of its inputs is low, then its output is high, and if all of its inputs are high, then it output is low. An auxiliary circuit 40 monitors the value of the supply voltage (VDD2-VSS2) and generates an output signal NRES on wire 30. If the supply voltage is inadequate for proper circuit operation, as may occur on a transient basis when the circuit is first activated, the output signal NRES will go to a logic low level. This causes the flip-flop to assume a known state so that the level translator output signal VOUT will be at a logic low level. Alternatively, the inverter I5 could have been replaced by the NAND gate instead, so that the known state on VOUT would be a logic high level. Whenever power is applied to this circuit the level translator will assume the previously chosen known state.

Figure 7:
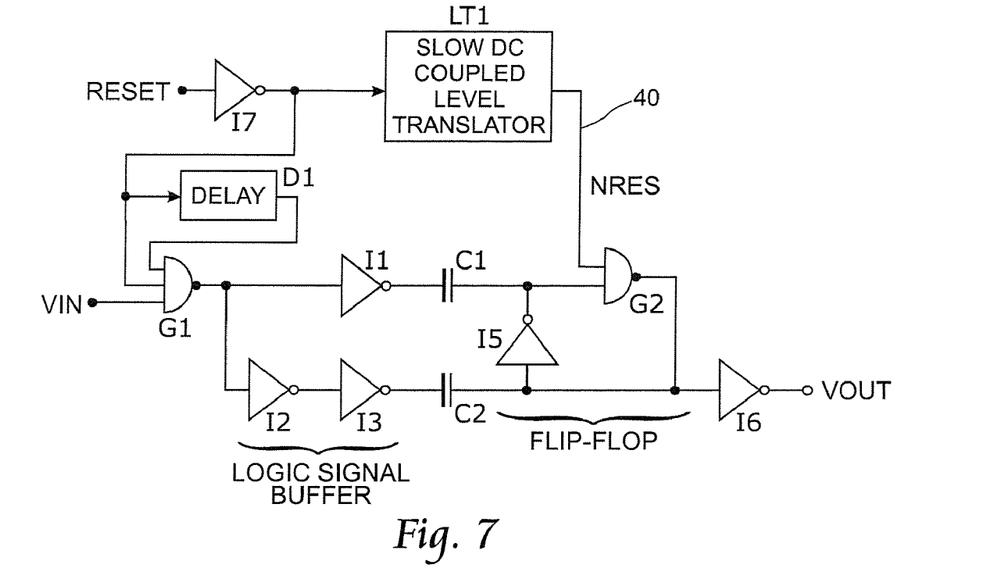
FIG. 7 is a logic diagram of a high speed logic level shifter with external reset according to the present invention.

FIG. 7 shows another method of controlling the startup state of the level translator by providing an external RESET input signal means. When the input RESET is taken high to an active state, it acts to block the transmission of changing inputs from VIN, and then sets the state of the flip-flop to a known value. The RESET input first goes through logic inverter I7 to create a logic low level, which is used to block signal transmission by using the NAND logic gate G1. The active low RESET signal is also sent through a DC coupled level translator LT1 to create a replica logic signal NRES on wire 40 which is at the signal levels needed by the floating logic circuitry. The DC coupled level translator may use a cross-coupled flip-flop transistor pair driven by differential currents as known in the state of the art. The signal NRES is then used to cause the output of NAND logic gate G2 to go high, setting the flip-flop formed by gate G2 and inverter I5 to a known state. This state corresponds to the state being output by NAND gate G1, so the portions of the circuit at the ground level and at the floating supply level have corresponding logic states.

A delay element D1 is used to delay a copy of the inverted RESET signal to go to an additional input of logic gate G1. The delay element is chosen so that its output changes will always occur after the output changes of the DC coupled level translator. In the cases when it cannot be guaranteed that the input signal VIN will be at a logic low level whenever the RESET input is active, the delay device causes the signals being transmitted through the capacitors C1 and C2 to correspond to the reset state. The output of the delay element is connected to an additional input of the logic gate G1 so that for a period of time after the RESET signal is turned off, the output of gate G1 will remain at a logic high state. This compensates for the time delay in the slow DC coupled level translator which is driving the floating circuitry. When the RESET input is low, all the associated inputs to gates G1 and G2 are at a logic high state, so that the signal changes at the input VIN may be transmitted to the output VOUT as previously detailed in the circuit of FIG. 3. Since an extra signal inversion is present in gate G1, the output buffer inverter I7 of FIG. 3 has been deleted. This causes VOUT to have the same logic polarity as the input signal VIN. In some special cases where the state of VIN is known, the delay element D1 and the third input to gate G1 may be omitted. As discussed previously, the RESET input signal may be derived completely or in part from an under voltage detector which monitors various power supply voltage conditions in the circuit.

Figure 8:
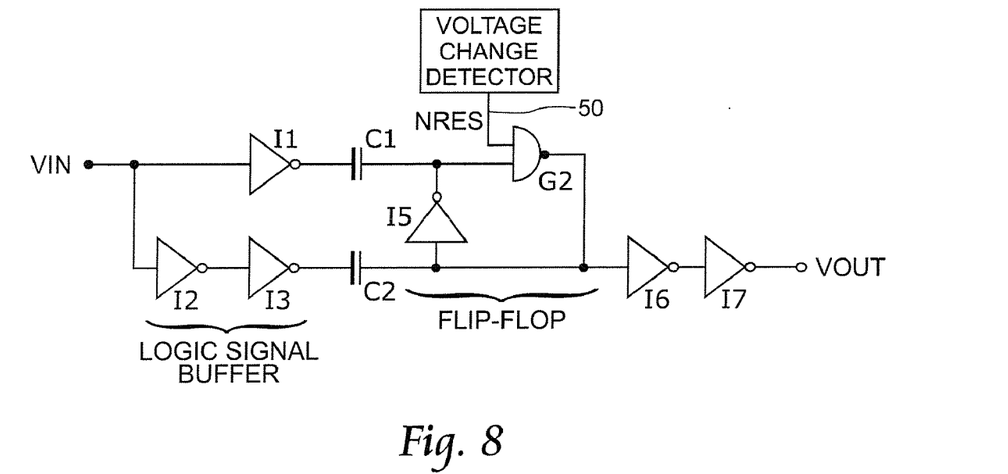
FIG. 8 is a logic diagram of a high speed logic level shifter with supply voltage rate-of-change detector according to the present invention.

FIG. 8 shows another method of providing control of the output state of the logic voltage level translator. The under voltage detector of FIG. 6 is replaced with a voltage change detector VCD. The voltage change detector determines if any or a chosen power supply voltage for the level translator circuit changes rapidly. Of particular concern is a rapid change in the value of VPP or VNN; which is the voltage normally impressed across the coupling capacitors C1 and C2. Rapid voltage changes will cause undesired displacement currents to flow in the terminals of the capacitors C1 and C2, and may cause the flip-flop formed by I4 and I5 to assume an undesired state. Use of a voltage change detector can determine if this condition is present and reset the flip-flop to a desired known state so that circuit operation will be as desired. When the power supply voltage changes too quickly, the voltage change detector causes the signal NRES on wire 50 to go to a logic low state. This takes one input of gate G2 low, setting the flip-flop to a desirable known state. As a result, the level translator output voltage VOUT assumes a desired state.

Figure 9:
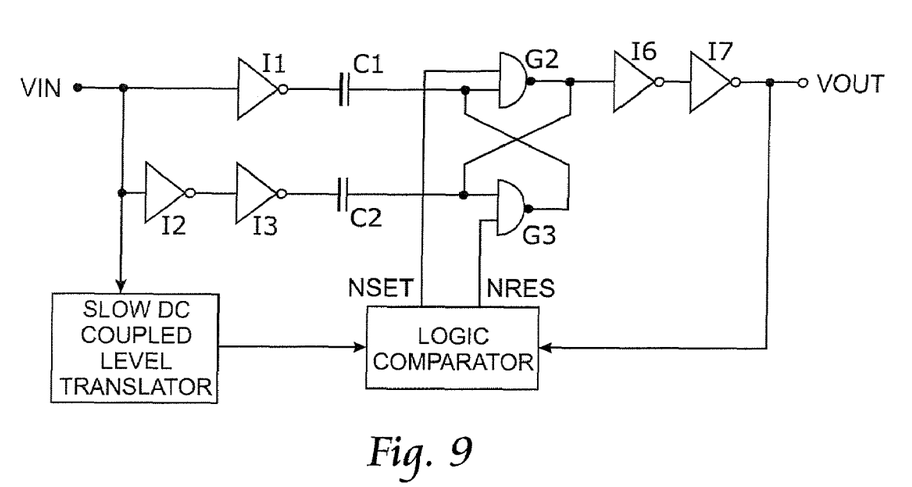
FIG. 9 is a logic diagram of a high speed logic level shifter with automatic correction according to the present invention.

FIG. 9 shows another method of providing control of the output state of the logic voltage level translator. The under voltage detector of FIG. 6 is replaced with a logic level comparator LC, which continuously compares the input VIN with the output VOUT using logic as known in the state of the art. If the two signals do not agree, then one of the signals NRES or NSET goes low and is sent to the flip-flop made with G2 and G3. Both inverters I4 and I5 of FIG. 3 are replaced with corresponding NAND gates G2 and G3 to provide auxiliary set and reset inputs for the flip-flop. If VOUT is low and VIN is high, a set command is sent to the flip-flop, and if VOUT is high and VIN is low, a reset command is sent to the flip-flop. A timer in the logic comparator allows for the delay in the slow DC coupled level translator which is used to provide information about the input signal VIN state to the logic level comparator. This timer uses principles well known in the state of the art to generate an output measured from the last signal disagreement time. If the signals disagree for less than a previously chosen time, then the set or reset signals are not generated. This prevents errors during transient changes in VIN. The circuit discussed here has the advantage of providing automatic correction of the logic level translator output state if noise or transient disturbances cause an error in the value of VOUT. The function of gates G2 and G3 as shown in FIG. 9 may be replicated by any of a number of other methods well known in the state of the art.

All of the techniques discussed in FIGS. 6 through 9 may be used in combination together with other methods not disclosed here by one familiar in the state of the art. No specific method is required to be used, and the choice of the combination depends on the application of the logic level translator.

Further, it should be understood that the invention is not necessarily limited to the specific process, arrangement, materials and components shown and described above, but may be susceptible to numerous variations within the scope of the invention. For example, although the above-described exemplary aspects of the invention are believed to be particularly well suited for an ultrasound transducer driver, it is contemplated that the concepts of the present invention can be applied in other applications as well.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes and adaptations, and the same are intended to be comprehended within the meaning and range of equivalents of the appended claims.

What is claimed is:

1. A high speed logic signal level shifter comprising:
a logic signal buffer having first and second outputs, wherein the logic signal buffer receives an input signal and generates a first set of current pulses, the logic signal buffer generates a second set of current pulses when the input signal transitions from a first state to a second state;
a binary flip-flop circuit coupled to the logic signal buffer comprising a first inverter and a first NAND gate connected in a feedback loop so an output of the first inverter connects directly to an input of the first NAND gate, and an output of the first NAND gate connects directly to an input of the first inverter;
a first coupling capacitor directly attached to the first output of the logic signal buffer and to the output of the second inverter of the binary flip-flop circuit, the first coupling capacitor forcing a change of state of the binary flip flop based on one of the first set of current pulses and the second set of current pulses generated by the logic signal buffer; and
a second coupling capacitor directly attached to the second output of the logic signal buffer and to the output of the first inverter of the binary flip-flop circuit, the second coupling capacitor forcing a change of state of the binary flip flop based on one of the first set of current pulses and the second set of current pulses generated by the logic signal buffer;
a reset signal circuit for setting the binary flip-flop to a known state with a reset signal; and
a DC coupled level translator for connecting the reset signal circuit to the binary flip-flop circuit;
wherein the logic signal buffer has a peak-to-peak output voltage approximately equal to an input signal swing of the binary flip-flop.

2. The high speed logic signal level shifter of claim 1, further comprising an output buffer coupled to the binary flip flop circuit.

3. The high speed logic signal level shifter of claim 1, further comprising a second NAND gate for preventing an input to the logic signal buffer during times that the reset signal is active.

4. The high speed logic signal level shifter of claim 3, further comprising a delay circuit coupled in series with at least one reset signal path to the second NAND gate.

5. The high speed logic signal level shifter of claim 1, further comprising a power supply under voltage detection circuit to provide the reset signal.

6. The high speed logic signal level shifter of claim 1, further comprising a means for detecting a rate of change of at least one power supply voltage, and providing the reset signal whenever the at least on power supply voltage rate of change exceeds a chosen value.

7. The high speed logic signal level shifter of claim 1, further comprising a logic comparison circuit having a first input coupled to the logic signal buffer, and a second input coupled to the binary flip-flop.

8. The high speed logic signal level shifter of claim 7, wherein the logic comparison circuit output is coupled to at least one of the set or reset inputs of the binary flip-flop.

9. The high speed logic signal level shifter of claim 7, wherein the logic comparison circuit includes a time delay.

10. A bipolar high voltage driver circuit comprising:
- a high voltage P-channel MOSFET transistor with its source terminal connected to a high voltage positive supply;
- a high voltage N-channel MOSFET transistor with its source terminal connected to a high voltage negative supply;
- a first high speed logic signal level shifter comprising:
  - a logic signal buffer having an input and a differential output providing true and complimentary outputs;
  - a binary flip-flop circuit with set and reset inputs coupled to the logic signal buffer;
  - a first coupling capacitor coupled to the true output of the logic signal buffer and to the set input of the binary flip-flop circuit; and
  - a second coupling capacitor coupled to the complementary output of the logic signal buffer and to the reset input of the binary flip-flop circuit;
- wherein the output buffer of the first high speed logic signal level shifter biased to drive the gate of the high voltage P-channel MOSFET transistor; and
- a second high speed logic signal level shifter according to claim 2, with the output buffer of the second high speed logic signal level shifter biased to drive the gate of the high voltage N-channel MOSFET transistor.

* * * * *